's Patent

United States Patent [19]
Kabeshita et al.

[11] Patent Number: 5,012,388
[45] Date of Patent: Apr. 30, 1991

[54] ELECTRODE STRUCTURE OF A CHIP TYPE ELECTRONIC COMPONENT

[75] Inventors: Akira Kabeshita, Hirakata; Tokuhito Hamane, Nara; Yoshifumi Kitayama, Hirakata, all of Japan

[73] Assignee: Matsushita Electric Industrial Co., Ltd., Osaka, Japan

[21] Appl. No.: 425,840

[22] Filed: Oct. 20, 1989

[30] Foreign Application Priority Data

Oct. 20, 1988 [JP] Japan .............................. 63-264525

[51] Int. Cl.$^5$ .............................................. H05K 7/02
[52] U.S. Cl. .................................... 361/400; 361/405
[58] Field of Search ................. 361/400, 402, 404–405

[56] References Cited

U.S. PATENT DOCUMENTS

| | | | |
|---|---|---|---|
| 4,695,927 | 9/1987 | Barre | 361/400 |
| 4,777,564 | 10/1988 | Dertiny et al. | 361/405 |
| 4,818,823 | 4/1989 | Bradley | 361/400 |

FOREIGN PATENT DOCUMENTS 1466264 12/1968 Fed. Rep. of Germany ...... 361/405
2445050 4/1976 Fed. Rep. of Germany ...... 361/404

*Primary Examiner*—Gregory D. Thompson
*Attorney, Agent, or Firm*—Wenderoth, Lind & Ponack

[57] ABSTRACT

A chip type electronic component includes a main body having opposite first and second end surfaces and a lower surface defining a first plane. First and second electrode portions are respectively connected to the first and second end surfaces of the main body. Each of the first and second electrode portions includes a lower surface. Each lower surface of the first and second electrode portions includes a first planar face extending adjacent the main body in a second plane which is parallel to the first plane defined by the main body, and a second planar face extending adjacent the first planar face in a third plane which extends upwardly at an angle relative the second plane away from the main body. Accordingly, upon mounting of the chip type electronic component to a planar circuit board, a space is provided between the second planar face of each of the first and second electrode portions for accommodating solder materials.

10 Claims, 2 Drawing Sheets

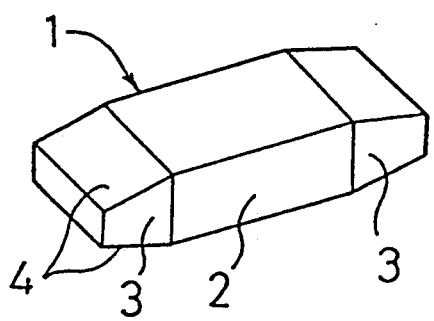
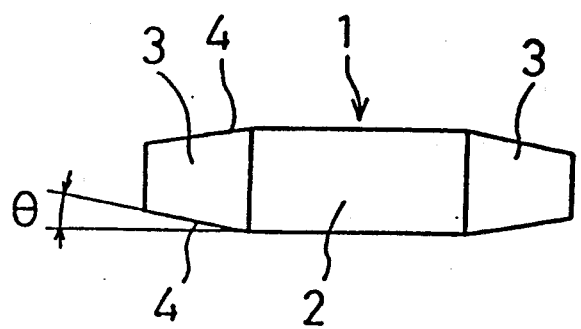
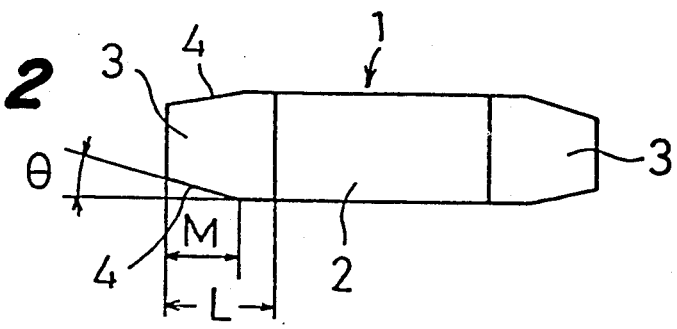
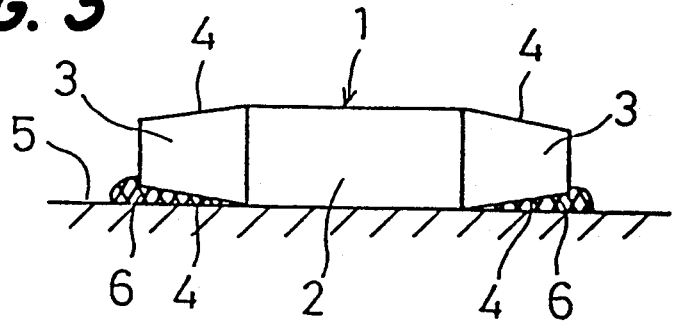
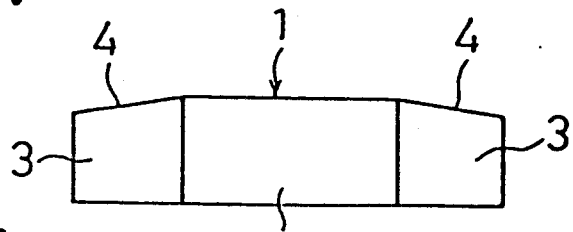
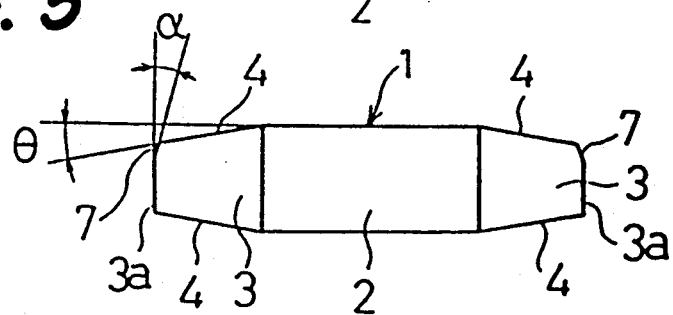

ELECTRODE STRUCTURE OF A CHIP TYPE ELECTRONIC COMPONENT

BACKGROUND OF THE INVENTION

The present invention relates to chip type electronic components and, in particular, to chip type electronic components having an increased reliability during soldering of electrodes on a circuit board.

The chip type electronic components have been produced in which breaking lines for dividing and cutting are formed lengthwise and crosswise in a checkerboard fashion on the surface of a common ceramics board. Electrode portions are provided at each end of each chip component, and an electronic portion, such as a resistor, capacitor, or the like, is formed for each chip component between these electrode portions. Then, the ceramics board is cut in a slip shape along the breaking lines in one direction, for example lengthwise. The electrode portions are formed such that both the upper and lower faces contact the side face by the application of an electrode material at the terminal and lower faces of the electrode portions. The slip shape board is thin cut along the breaking lines in the other direction, that is crosswise, to obtain each chip component.

Thus, as shown in FIGS. 6 and 7, the chip type electronic component 11 includes the electrode portions 13, having the upper and lower faces of continuous electrode materials, formed at both ends of the main body 12 which is composed of ceramics and which is a rectangular parallelpiped. The electronic portion is formed between these electrodes portions 13. At each of the end faces 13a of the electrode portions 13 a slope 14 is formed according to the breaking lines. The slope 14, for example, has an inclination angle $a$ of 15 degrees and a depth B which is about one-fourth the chip component thickness.

SUMMARY OF THE INVENTION

In recent years, there has been a continual trend towards miniaturization. For example, miniaturized components having a size of 1.6×0.8 mm or 1.0×0.5 mm are becoming more common. Additionally, in the case where the chip type electronic component 11 is to be mounted on the circuit board 15, the electrode portions 13 are connected to the conductor portions of the circuit board 15 by the application of molten solder 16 on the conductor portions of the circuit board 15, to which the chip type electronic component 11 is mounted. The molten solder 16 is then made to reflow. However, when the chip type electronic component 11 is mounted, the molten solder 16 overflows along the sides between the lower face of the electrode portions 13 and a conductor surface of the circuit board 15, and the solder-adhering amount thus exhibits a scattered distribution. If the molten solder 16 is made to reflow under these conditions, due to a difference in the surface tension of the solder during hardening at each of the electrode portions of the chip type electronic component 11, as shown in FIG. 8 (a) and FIG. 8 (b), there appears a phenomenon in which the chip type electronic component 11 is lifted from the surface of the circuit board 15 at one end. This is the so-called Manhattan phenomenon, which is a problem to be solved.

From consideration of the above-described problems, an object of the present invention is to provide a chip type electronic component of high reliability which, even upon miniaturization of the chip type electronic component, does not tend to be lifted at one end during soldering, and which therefore results in superior jointing.

The chip type electronic component of this invention is characterized by the provision of an inclined plane along the lower surface of the electrodes relative to a surface of the circuit board to which the lower faces of the electrode portions are to be mounted.

Furthermore, it is preferred to form the inclined plane in a region comprising 50% or more of the lower face of the electrode portion facing the circuit board, and to form the inclination angle at 45 degrees or less relative to the surface of the circuit board.

According to the present invention, when molten solder is applied to conductor portions on the surface of a circuit board and an electronic part is then mounted, since an include plane is formed in the electrode portions, a space for the solder is provided between the electrodes and the circuit board. Therefore, the molten solder does not exhibit a scattered distribution, nor is there an overflow as well. When the solder is made to reflow and then to harden, the Manhattan phenomenon, that is lifting up of one end of the chip electronic component, can be effectively prevented and soldering of high reliability can be performed. To form sufficient space for the solder, it is preferred that the inclinde plane be formed along 50% or more of the face of the electrode facing the circuit board surface, and if the inclination angle exceeds 45 degrees, the effect on the room formation for the solder becomes lower. Furthermore, if breaking lines are formed in addition to the inclined plane, chip cutting can be performed more properly and easily.

BRIEF DESCRIPTION OF THE DRAWINGS

FIG. 1 (a) and FIG. 1 (b) are, respectively, a perspective view and a front view of a chip type electronic component of the present invention.

FIG. 2 is a view to explain the formation of an inclined plane and an inclination angle of the present invention.

FIG. 3 is a front view to show mounting conditions on a circuit board.

FIGS. 4 and 5 are, respectively, a front view of modified examples of the present invention.

DESCRIPTION OF THE INVENTION

Figure 6:
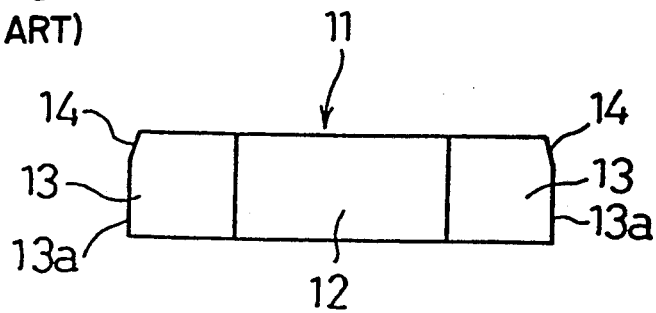
FIG. 6 is a front view showing a prior art example.
Figure 7:
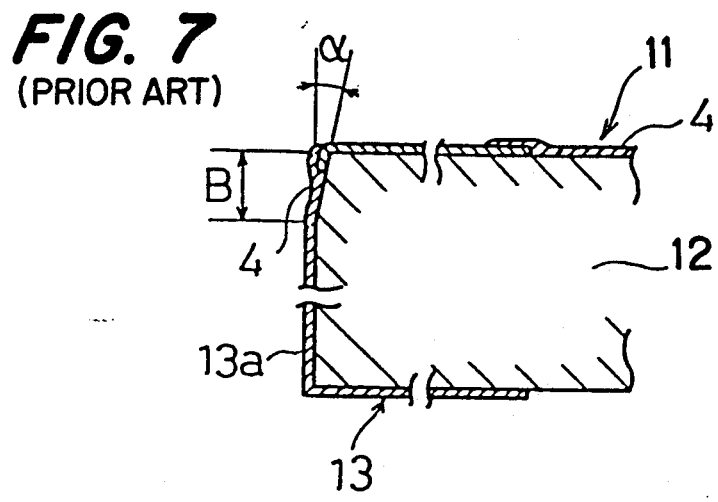
FIG. 7 is an enlarged sectional view of the prior art example.
Figure 8A:
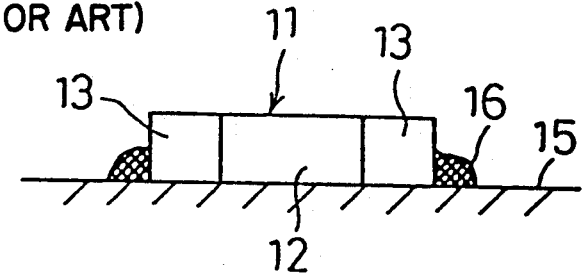
FIG. 8 (a) and FIG. 8 (b) are front views showing a condition change when mounting and soldering are carried out in the prior art example.
Figure 8B:
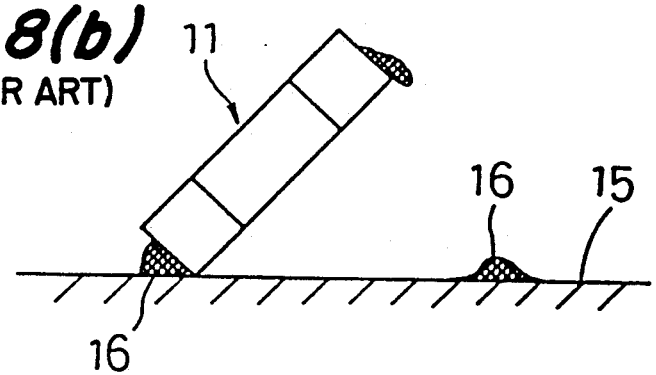

Hereinafter, the present invention is illustrated with reference to FIGS. 1-5.

In FIG. 1, reference numeral 1 denotes a chip type component (hereinafter referred to as a chip component), shaped as a rectangular parallelepiped, and constructed as a resistor, capacitor, or the like. That is, the component may be constructed as a resistor in which the main body 2 is composed of ceramics chips and a resistive material (not shown in figures) formed between the electrode portions 3, or the chip component may be constructed as capacitor having the formation of a layered body (not shown in figure) of electrodes and dielectrics.

The electrode portions 3 are formed by applying an electrode material having upper and lower faces to opposite ends of the main body 2. The upper and lower faces of the electrode portions 3 are positioned along an included plane 4 which extends at an angle Θ relative to the upper and lower faces of the main body 2, that is, relative to the surface of the circuit board 5 to which the chip component 1 is mounted. Moreover, the resistive body or layered body are formed at an upper side face of the main body 2.

The inclined plane 4, as shown in FIG. 2, is formed such that the distance M equals 0.5~1.0×L, L being the length of the electrode portion 3. The inclination angle Θ is set at 45 degrees or less, and most preferably, at 5~20 degrees.

According to the above configuration, as shown in FIG. 3, when the chip component is mounted using molten solder 6 on the conductor face (not shown in the figure) of the circuit board 5, since the lower face of the electrode portions 3 incline at an angle Θ relative the conductor face of circuit board 5, a space having a triangular cross-section is provided between the electrode portions 3 and the conductor face of circuit board 5. This space allows room for the molten solder 6 and thus helps prevent the molten solder 6 from overflowing along the sides. Accordingly, when the molten solder 6 is made to reflow by inserting the circuit board 5 having the mounted chip component 1 into a heating furnace or some other heating means, the surface tension operates uniformly at both ends of the chip component 1 during hardening of the solder, thereby preventing generation of the Manhattan phenomenon.

Although an example is presented which includes formation of the inclined plane 4 on the upper and lower faces of both ends of the chip component 1, it is sufficient that, as shown in FIG. 4, an inclined plane 4 be formed along one face only. The thus formed inclined plane 4 as shown in FIG. 4 comes to face the circuit board 5 when the chip component 1 is mounted. The electronic portion may be formed between the electrode portions 3 of the chip component 1 in relations to the faces of the electrode portions 3 having the inclined plane 4 or the other faces. In the aforementioned case, the electronic portion is mounted contacting the circuit board, and also in this case, formation of the electrode portions 3 can be made in only one face by applying an electrode material for only the faces where each inclined plane 4 of the electrode portions 3 is formed. On the other hand, in the case of the latter, the electronic portion is placed above and the chip component 1 is mounted such that the inclined lane 4 is in contact with the circuit board 5.

Furthermore, in above mentioned example, when the chip component 1 is produced, V letter-like notches which become the inclined plane 4 after being cut are formed, and breaking lines for cutting also have to be formed on the ceramics board. The electrode portions 3 are formed by applying an electrode material at an area in the inclined plane 4 side where the electrode portions 3 are formed, and an electronic portion is formed between the electrode portions 3. The ceramics board is then broken by cutting between the inclined planes 4 and 4. The electrode portion 3 is completed by applying an electrode material to the terminal lower faces of both the side faces. Cutting at the breaking lines is then carried out for dividing each of the chip components. However, in the case where cutting is carried out using the border line itself of the inclined plane 4 as a cutting line, due to a very large opening angle it may be that the cutting itself may become difficult, and constant cutting along a straight line may not be possible. In these cases, it is recommended that additional breaklines for cutting be formed at the boundary between the inclined plane 4, and that the chip component 1 in these cases, as shown in FIG. 5, have formed a cutting slope 7 which is formed by the breaking lines for cutting at the boundary part between the side face 3a of the electrode portions 3 and the inclined plane 4. The inclination angle α for this cutting slope 7 is, for example, about 15 degrees relative to the side face 3a of the electrode portions 3.

As is clarified by this explanation, by using the chip type electronic component of the present invention, since an inclined plane is formed in the electrode portions and a space for the solder is provided between the conductor face of the circuit board and the electrode face of the chip component, large scattering and overflowing of the molten solder does not take place and thereby the Manhattan phenomenon is effectively prevented. Thus, it is possible to carry out a highly reliable soldering operation.

Furthermore, by providing the inclined plane along a region of 50% or more of the electrode face which faces the circuit board surface and by providing an inclination angle which does not exceed 45 degrees, sufficient space for the solder can be surely formed and the above-described effects can be certainly realized.

Furthermore, by making the inclined plane for cutting at the boundary part between a side face of the electrode portion and the inclined plane, the cutting of the chip component is made proper and easy.

We claim:

1. A chip type electronic component comprising:
   a main body having opposite first and second end surfaces and a lower surface, said lower surface of said main body defining a first plane; and,
   first and second electrode portions respectively connected to said first and second end surfaces of said main body;
   wherein each of said first and second electrode portions comprises a lower surface;
   wherein each lower surface of said first and second electrode portions comprises a first planar face extending adjacent said main body in a second plane which is substantially parallel to the first plane defined by said main body, and a second planar face extending adjacent said first planar face in a third plane which extends upwardly at an angle relative the second plane away from said main body.

2. A chip type electronic component as recited in claim 1, wherein the first plane and the second plane are substantially coplanar.

3. A chip type electronic component as recited in claim 1, wherein said angle between the second plane and the third plane is a maximum of 45 degrees.

4. A chip type electronic component as recited in claim 2, wherein said angle between the second plane and the third plane is a maximum of 45 degrees.

5. A chip type electronic component as recited in claim 5, wherein each of said first and second electrodes extend a first distance in a first direction relative to said main body, and wherein each second planar face of said first and second electrodes defines a second distance along the first direction, and wherein the second distance is at least 50% of the first distance.

6. A chip type electronic component as recited in claim 2, wherein each of said first and second electrodes extend a first distance in a first direction relative to said main body, and wherein each second planar face of said first and second electrodes defines a second distance along the first direction, and wherein the second distance is at least 50% of the first distance.

7. A chip type electronic component as recited in claim 3, wherein each of said first and second electrodes extend a first distance in a first direction relative to said main body, and wherein each second planar face of said first and second electrodes defines a second distance along the first direction, and wherein the second distance is at least 50% of the first distance.

8. A chip type electric component as recited in claim 4, wherein each of said first and second electrodes extend a first distance in a first direction relative to said main body, and wherein each second planar face of said first and second electrodes defines a second distance along the first direction, and wherein the second distance is at least 50% of the first distance.

9. A chip type electronic component comprising:
   a main body having opposite first and second end surfaces and a lower surface, said lower surface of said main body defining a first plane; and
   first and second electrode portions respectively connected to said first and second end surfaces of said main body;
   wherein each of said first and second electrode portions comprise a lower surface;
   wherein each lower surface of said first and second electrode portions comprises a planar face extending adjacent said main body in a second plane which extends upwardly at an angle relative the first plane away from the lower surface of the main body.

10. A chip type electronic component as recited in claim 9, wherein said angle between the first plane and the second plane is a maximum of 45 degrees.

* * * * *